United States Patent [19]

MacKenzie

[11] Patent Number: 4,511,820
[45] Date of Patent: Apr. 16, 1985

[54] BIASED HOLDER FOR A CRYSTAL WAFER

[75] Inventor: Keith W. MacKenzie, Lindenhurst, Ill.

[73] Assignee: Netcom, Inc., Northbrook, Ill.

[21] Appl. No.: 543,414

[22] Filed: Oct. 19, 1983

[51] Int. Cl.³ .................................................. H01L 41/08
[52] U.S. Cl. .................................. 310/353; 310/355; 310/369
[58] Field of Search .................................. 310/351–356

[56] References Cited

U.S. PATENT DOCUMENTS

| 2,385,666 | 9/1945 | Watrobski | 310/355 |
| 2,471,625 | 5/1949 | Johnstone | 310/353 X |
| 2,784,326 | 3/1957 | Purdue | 310/353 |
| 2,824,981 | 2/1958 | Warden | 310/355 |
| 2,831,989 | 4/1958 | Ianouchevsky | 310/353 |
| 2,850,651 | 9/1958 | Hoffman | 310/353 |
| 3,340,410 | 9/1967 | Sanford | 310/353 |
| 4,136,297 | 1/1979 | Briese | 310/353 |

*Primary Examiner*—Mark O. Budd
*Attorney, Agent, or Firm*—Jerome Goldberg

[57] ABSTRACT

A holder for a piezoelectric crystal wafer comprising a base, a pair of spaced apart leaf springs secured to the base and a seat member secured to the base between the leaf springs. The leaf springs spread outward upon the application of an external force, to permit the placement of a crystal wafer on the seat member and return toward a normal position upon the release of the external force, to resiliently hold the crystal wafer on the seat member.

Each leaf spring includes a pair of prongs at the upper end thereof, separated by a slit having a width slightly larger than the thickness of the wafer. An elongated slot is formed in each of the leaf springs and having a width greater than the width of the slit between the prongs. When the crystal wafer is inserted in the holder, the upper part of the wafer is received in the slit of one leaf spring and a side portion of the wafer extends through the slot of the leaf spring. The upper defining edge of the slot contacts the edge of the side portion of the wafer, to prevent the leaf spring from returning to the normal position. Similarly, the opposite upper part of the wafer is received in the slit between the prongs of the other leaf spring, the opposite side portion of the wafer extends through the slot of the other spring, and the upper defining edge of the other spring contacts the edge of the opposite side portion, to prevent the other spring from returning to the normal position. The crystal wafer is cemented to the holder to at least connect with the prongs of one leaf spring, to connect with the prongs of the other leaf spring and to connect with the seat member, so that fixed mechanical connections are made at two spaced apart locations at the upper part of the crystal wafer and at the bottom part of the wafer.

14 Claims, 14 Drawing Figures

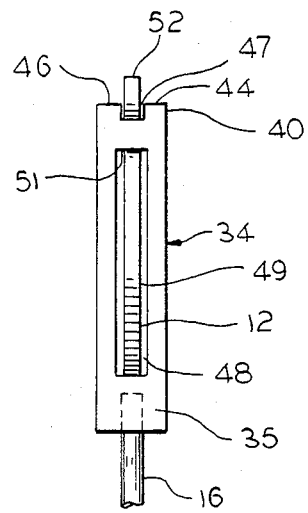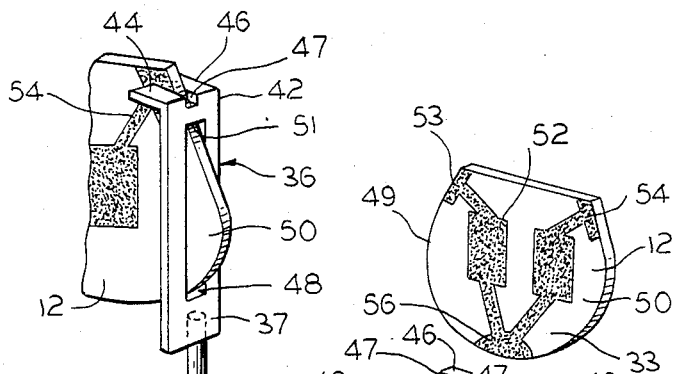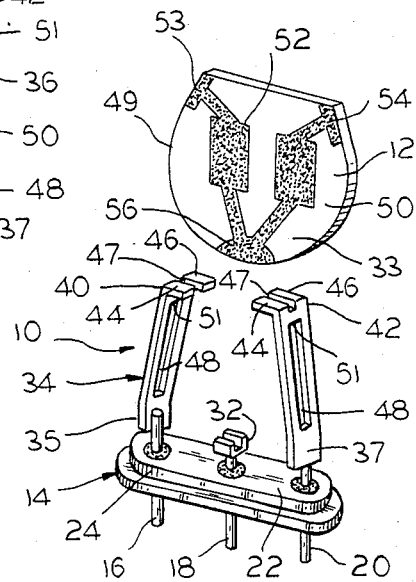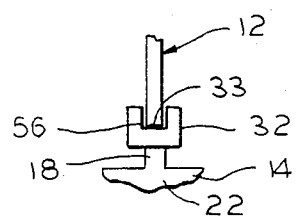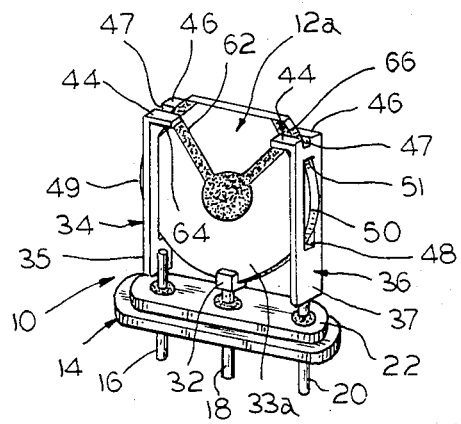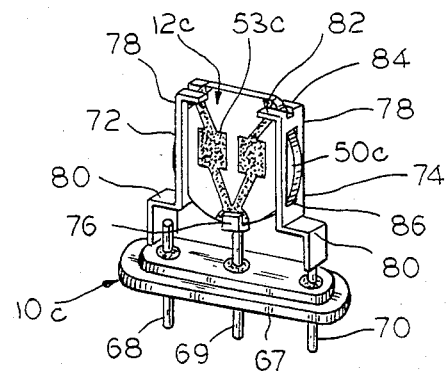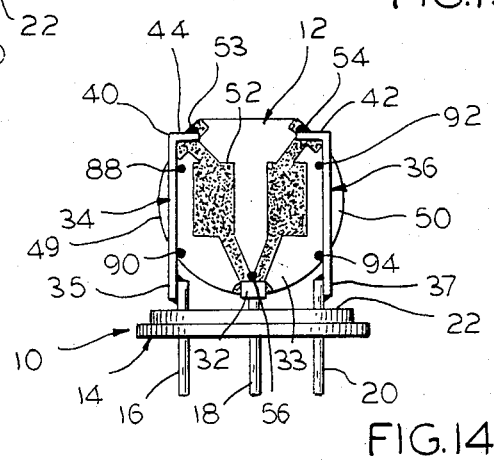

BIASED HOLDER FOR A CRYSTAL WAFER

BACKGROUND OF THE INVENTION

This invention relates generally to a holder or mount for a piezoelctric crystal used for determining electrical frequency, and more specifically relates to a holder for a piezoelectric quartz crystal wafer which securely supports the crystal wafer inside of a metal casing.

Electric filters are used, for example, to pass a band of electrical frequencies or to reject a band of electrical frequencies. When a filter requires a narrow bandwidth and/or a sharp cut off of the frequency response, a piezoelectric quartz crystal is usually utilized. Some of the areas crystal filters have wide application are: avionics communication and navigation, missiles, satellites, command destruct receivers, microwave telephone multiplex, amateur radio, military field radio, marine band radio, and broadcast and landmobile radio.

The holders or mounts for electrical crystals used prior to the invention herein generally comprised a base having a plurality of terminals, each connected to a point at the lower part of the crystal. This type of crystal holder is extensively used and is quite adequate in a low stress environment. However, under conditions of high shock and vibration, particularly when used in missile and satellite applications, for example, the crystals were subjected to severe stresses and were not sufficiently supported by the prior holder, and would often times short to the metallic outer casing or develope cracks in the body of the crystal.

Moreover, in the prior holders it was extremely difficult to maintain the distance substantially constant between the crystal and the outer metal casing. Hence, time consuming adjustment was required for varying the capacitance inorder to achieve the desired frequency response. By consistently positioning the crystal in the holder at substantially the same location, automation processes may be utilized for the inserting of the crystal in the holder, cementing the crystal to the holder and adjusting the crystal frequency.

The subject invention as more fully referred to below, overcomes the aforestated defects of prior crystal holders and provides a holder for piezoelectric crystals which supports the crystal under conditions of high stress. It also enables the crystal to be positioned at the same location with respect to the enclosure of the metallic outer casing, so that the capacitance between crystal and casing is maintained relatively constant. Therefore, the same circuit parameters could be used even at high frequencies, without adjustment, for reproducing the desired frequency response.

SUMMARY OF INVENTION

The crystal holder of this invention includes a base having a pair of elongated leaf springs secured at their lower or inner ends to the base, and a seat member secured to the base between the leaf springs. A crystal wafer is positioned on the seat member after the leaf springs are spread apart to an outer position. The leaf springs return inward when the spreading forces are released, to hold the crystal wafer under slight tension on the seat.

Each leaf spring includes a fork at the upper end which extends inward and comprises a pair of prongs separated by a narrow slit slightly wider than the thickness of the wafer. An elongated slot is formed in the body of the leaf spring having a width slightly larger than the width of the slit between the prongs, and the longitudinal center lines of the slit and slot lie on substantially the same plane. The wafer is operatively positioned between the prongs of the leaf springs at the upper part of the wafer, and opposite side portions of the wafer extend through the slots of the corresponding leaf springs. The cooperation of the narrow slit and the slightly wider slot of the leaf springs enables the crystal wafer to be properly centered in the holder.

The leaf springs in their normal position are spaced apart a distance less than the width of the crystal wafer. When inserting the crystal wafer into the slits between the prongs of the corresponding leaf springs, the leaf springs are caused to spread outward under the pressure applied by the wafer moving into the holder and opposite side portions of the wafer extend through the slots. This permits the crystal wafer to be positioned on the seat. After the crystal wafer is in place in the holder, the leaf springs resiliently move inward but are inhibited from returning to their normal position by the contact of the upper defining edge of the slot of the correponding spring with the edge of the side portion extending through, to hold the wafer on the seat under slight tension.

The crystal wafer is fixidly secured to the holder by applying electrically conductive epoxy or other suitable means, so that the prongs of each leaf spring and the seat are connected to the crystal. The cemented connections may correspond to electrical terminals, such as the input point, output point and the common point of the crystal circuit, although connections may be made soley to provide firm mechanical contact. Electrically conductive pins extend the terminals provided by the contact of the springs and seat with the crystal circuit to the outside of the holder, for access after a metallic casing is covered over the holder and crystal wafer. Thus, there are two spaced apart fixed connections at the upper part of the crystal wafer and one connection at the lower part of the crystal wafer between the other two connections. The distance between these connections forms a triangle. Since the fixed or cemented connections are positioned at the upper part and lower part of the crystal wafer and near the outer periphery thereof, the vibrating characteristics of the crystal wafer generated in the central area of the crystal are not effected.

In order to provide even greater support for the crystal in the holder without effecting crystal performance, the uppermost and lowermost parts of the side portions extending through the slots of the springs may be connected to the adjacent parts of the springs.

It is therefore a primary object of this invention to provide a holder for a piezoelectric crystal wafer for supporting the crystal wafer under conditions of severe stresses.

It is another primary object of this invention to provide a holder for a crystal wafer which enables accurate placement of the crystal wafer into a holder so that the capacitance between the crystal circuit and the metallic casing covering the crystal is substantially constant, permitting the use of the same design electrical components for reproducing a desired frequency response.

A feature of the invention is to provide a holder for a crystal wafer having a pair of leaf springs which may be spread apart manually or automatically to enable the crystal wafer to be inserted on a seat of the holder, and thereafter releasing the spreading force, so that the leaf springs resiliently hold the crystal wafer on the holder.

Another feature is to have the contact of the leaf springs at the upper or outer part of the crystal wafer at opposed ends thereof, and the contact of the seat with the crystal wafer at the lower or inner part of the crystal wafer and between the contacts of the leaf springs.

Another feature is to form an elongated slot in the leaf springs to permit passage through by opposite side portions of the crystal wafer when the crystal wafer is positioned in the holder.

Another feature is to provide a pair of leaf springs, each including a pair of prongs at the upper end thereof separated by a narrow slit having a width slightly greater than the thickness of the crystal wafer but less than the width of the slot, so that the wafer is received in the slits between the prongs and extends through the slots, to properly position the crystal wafer in the holder.

Still another object is to form slots in the leaf springs, so that the upper defining edges thereof, contact the crystal wafer to maintain the crystal in the holder under slight tension prior to cementing the crystal fixidly in place.

BRIEF DESCRIPTION OF THE DRAWING

Referring now to the several figures of the drawing, in which the same characters of reference are employed to indicate corresponding similar parts throughout the several figures of the drawing:

FIG. 8 illustrates the crystal wafer positioned through the elongated slot of the spring arm;

FIG. 9 is a fragmentary view to illustrate a side portion of the crystal extending through the slot of the spring arm;

FIG. 10 illustrates the crystal wafer spaced from the holder, prior to inserting into the holder and causing outward spreading of the spring arms;

FIG. 11 is a fragmentary enlarged view to illustrate the crystal wafer resting on the seat of the base;

FIG. 12 is a perspective front view of the crystal in the holder and illustrates such crystal having a two terminal circuit;

FIG. 13 illustrates the holder of the invention used for holding crystal wafers of smaller size; and FIG. 14 illustrates a seven point connection of the crystal to the holder.

DESCRIPTION OF THE PREFERRED EMBODIMENT

Figure 1:
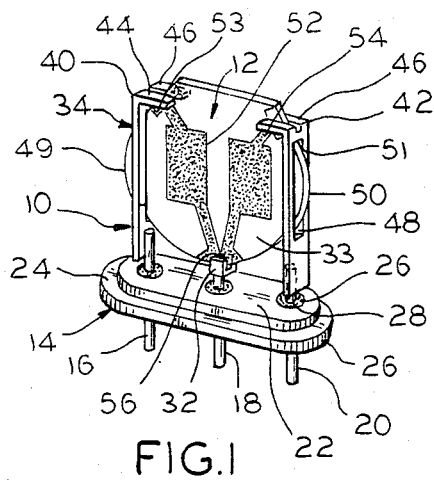
FIG. 1 is a perspective view of a crystal holder with the crystal wafer operatively positioned in the holder, embodying the principals of the invention.

Referring now to FIG. 1 of the drawings, the reference numeral 10 indicates generally a holder for a crystal wafer 12. The crystal wafer 12 is an electrical component used for precisely determining electrical frequency, and is formed from a quartz material.

The holder 10 includes a base 14 having three electrically conductive pins 16,18 and 20. The base comprises a platform 22 and a ledge 24 recessed from the platform 22. The base 14 is constructed from an electrically conductive material such as plated cold roll steel or plated kovar. Preferably, the pins 16,18 and 20 are constructed from a plated kovar material.

Openings 26 are formed in the base 14 and filled with electrically insulative material 28. Pins 16 and 20 extend through the insulative material. Pin 18 extends through the metallic base 14 and is positioned between pins 16 and 18 and is electrically connected to the base 14. However, pin 18 may also be insulated from the base 14, similar to pins 16 and 20.

A substantially "U" shaped seat 32 is attached to the upper end of pin 18 (as viewed in the drawing) to receive and hold the bottom part 33 of the crystal wafer 12.

An arm 34 is attached at the lower end 35 to the pin 16. Similarly, an arm 36 is attached at the lower end 37 to the pin 20. Each arm 34,36 is formed from an elongated, flexible, electrically conductive metallic material and acts as a leaf spring. The arms 34,36 have a normal position which is angled slightly inward, as may be seen in FIGS. 3 and 10, and a flexed, almost upright position, when the crystal wafer 12 is operatively positioned in the holder 10. As shown in FIG. 10, the distance between the arms 34,36 when in the normal position is less than the width of the crystal wafer 12.

Figure 3:
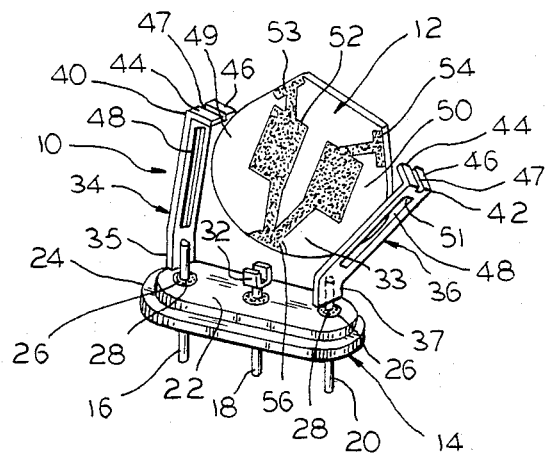
FIG. 3 illustrates one of the spring arms flexed outward to permit the insertion of the crystal wafer into the holder.
Figure 2:
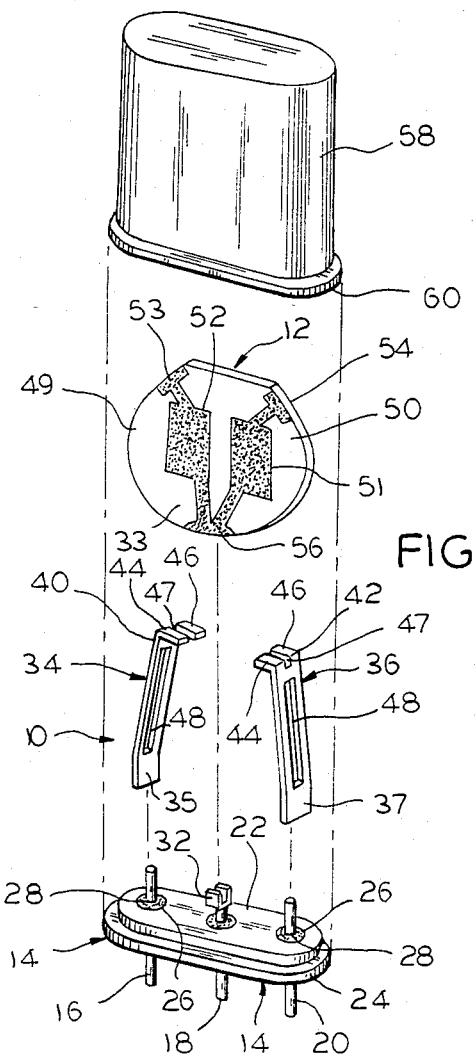
FIG. 2 is a perspective exploded view of the component parts of the crystal holder spaced from the outer casing for the crystal holder.
Figure 4:
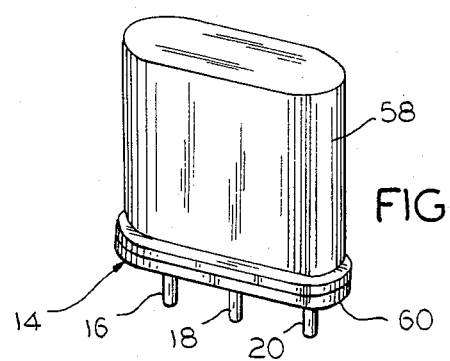
FIG. 4 illustrates the crystal holder with the casing secured thereon.

In FIG. 3, arm 36 is illustrated pulled outward from the normal position prior to positioning the crystal wafer 12 in the holder 10 and in the seat 32. However, both arms 34,36 may be and are preferably pulled or flexed outward from the normal position (FIG. 10), and thereafter the bottom part 33 of the crystal wafer 12 is placed on the seat member 32. Upon release of the pulling or flexing force, the arms 34,36 resiliently move inward but are inhibited from returning fully to the normal position by contact with the crystal wafer 12, thereby retaining the wafer under a slight tension in the holder 10 and on the seat 32 (FIG. 11).

In FIG. 10, the crystal wafer is shown spaced above the spring arms 34,36 and upon being inserted therebetween, as will be more fully detailed below, the arms 34,36 spread further apart under the force provided by the crystal wafer 12. When the wafer 12 is fully inserted in the holder 10, the arms 34,36 will resiliently hold the wafer in place. Then an electrically conductive cement or suitable epoxy is used to fixidly and operatively secure the crystal wafer 12 in the holder 10.

The upper ends 40,42 of the arms 34,36 extend inward so that the arms 34,36 are formed into a substantially inverted "L" shape. Each end 40,42 is bifurcated or forked into spaced apart prongs 44,46. A narrow slit or space 47 separates the prongs 44,46 and has a width slightly greater than the thickness of the crystal wafer 12, as may be seen in FIG. 8.

Each arm 34,36 includes an elongated slot 48 to receive opposite side portions 49,50 therethrough. As may also be seen from FIG. 8, the width of the slot 48 is greater than the width of the slit 47, and the longitudinal center lines of the slot 48 and slit 47 lie substantially on the same plane.

The crystal wafer 12 is centered by the cooperation of the slit 47 between the prongs 44,46 and the slot 48

(FIG. 8). In the oprative position, the crystal wafer 12 is spaced from the prongs 44,46 and spaced from the defining edges of the slots 48 except for the contact with the upper edges 51 of slots 48, as may be seen in FIG. 9 (Due to the narrowness of the slit 49, the wafer may be in slight contact with one of the prongs 44,46.) The contact with the upper edges 51 inhibit the arms 34,36 from returning to the normal inward position shown in FIGS. 3 and 10. The central positioning of the crystal wafer 12 in the holder 10 is repeatible in the same location due primarily to the slit 47 having a width less than the width of the slot 48 and the longitudinal center lines of the slit and slot lying on substantially the same plane.

The crystal wafer 12 includes an electronic crystal circuit 52 having an input 53, an output 54 and a common point 56. As viewed in the drawings, the input point 53 and output point 54 are positioned at the upper part of the wafer but adjacent opposite ends thereof. The common point 56 is positioned between the input point 53 and the output point 54, but at the lower part 33 of the wafer 12.

As stated above, the arms 34,36 should be pulled or flexed apart to an outward position when inserting the wafer 12 in the holder 10. This may be accomplished by first positioning the crystal wafer 12 into the slits 47 of the spring arms 34,36 and in contact with the upper ends 40,42 of the spring arms 34,36, to cause the arms 34,36 to spread outward under the force of the crystal wafer 12. The wafer 12 is then lowered, so that the side portions 49,50 extend through the slots 48 of arms 34,36 and the lower part 33 including contact point 56 rests on the seat 32. The arms 34,36 remain flexed due to the contact of the edges of the side portions 49,50 with the edges 51 of the arms 34,36.

Alternatively, the spring arms 34,36 may be pulled outward, and the crystal wafer 12 inserted therebetween and the lower part 33 including contact point 56 positioned on the seat 32. Then the forces acting on the arms 34,36 are released, so that upper spaced apart portions of the wafer 12 position in the slits 47 between the prongs 44,46 of the arms 34,36 and the side portions 49,50 extend through the slots 48 of the arms 34,36. The arms remain flexed and prevented from returning to the normal position due to the contact of the upper edges 51 defining the slots 48 with the edges of the side portions 49,50 of the wafer 12.

Figure 5:
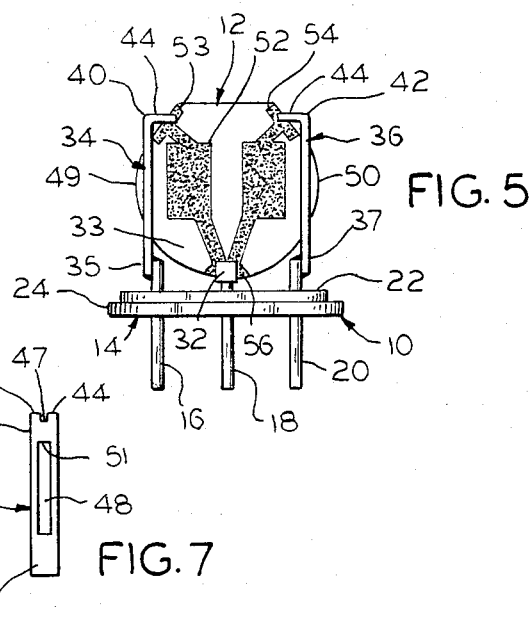
FIG. 5 is the front view of the crystal positioned in the crystal holder.
Figures 6, 7:
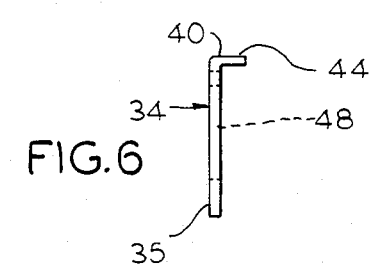
FIG. 6 is a front view of one of the spring arms of the holder.
FIG. 7 is a side view of the spring arm of FIG. 6.

After the crystal wafer 12 is properly positioned and centered in the holder 12 (FIG. 5), the wafer 12 is fixidly attached to the holder 10 with an electrically conductive epoxy, applied to the prongs 44,46 of arm 34 and to the input point 53, to the prongs 44,46 of arm 36 and to the output point 54, and to the seat 32 and to the common point 56. Thus, three fixed contacts are made between the crystal wafer 12 and holder 10, and the distance between the fixed contact points form substantially an equilateral triangle. These cemented fixed contacts provide both mechanical and electrical connections without stressing the wafer 12 in the holder 10.

The holder 10 with the crystal wafer 12 secured therein is enclosed within a metallic casing 58. The bottom edge 60 of the casing 58 rests on the ledge 24 and secured thereto by welding, soldering or other suitable means. Thus, the casing 58 is at the same electrical potential as the common point 56 of the crystal circuit 51. However, if the common point 56 is isolated from the casing 58, the casing 58 would not be at the same potential.

Pins 14,16 and 18 extend out from the bottom of the base 14 when casing 58 is covering the holder 10 and wafer 12, and are electrically connected respectively to input 53 via the spring arm 34, to common point 56 via the seat 32, and to the output point 54 via the spring arm 36.

Turning now to FIG. 12, a crystal wafer indicated by the reference numeral 12 and a suffix "a" is illustrated having a two terminal electrical circuit 62 including an input 64 and an output 66. The input 64 is cemented to the prongs 44,46 of spring arm 34 to provide a fixed mechanical contact with the holder 10 and an electrical connection with the spring arm 34, and the output 66 is cemented to the prongs 44,46 of spring arm 36 to provide a fixed mechanical contact with the holder 10 and an electrical connection with the spring arm 36. The seat 32 is also cemented to the crystal wafer 12a but only to provide a fixed mechanical connection with the holder 10 at the lower part 33a of the wafer 12a.

In FIG. 13 another embodiment of the invention herein is illustrated and comprises a holder indicated generally by the reference numberal 10 and the suffix "c" suitable for holding a smaller type crystal wafer 12c. The holder 10c includes a base 67 having three electrically conductive pins 68,69, and 70. Spring arms 72,74 are attached to pins 68 and 70, and a seat member 76 is attached to pin 69 between pins 68 and 70.

Each spring arm 72,74 has a substantially "Z" shape, including a main part 78 and a linking part 80 for connecting to the corresponding pin 68,70. The main part 78 includes a pair of spaced apart prongs 82,84 at the upper end thereof and a slot 86. The wafer 12c is operatively positioned in the holder 10c in the same manner as wafer 12 is positioned in holder 10. The linking part 80 is dimensioned so that the arms 72,74 receive and hold the crystal wafer 12c under tension.

In FIG. 14, the crystal wafer 12 is cemented to the holder 10 at seven locations. Three connections are the same as shown in FIG. 1—at input 53, at output 54 and at the common point 56. A cement connection 88 is made to arm 34 at substantially the highest location the wafer 12 extends through slot 48, which includes the location of contact between the wafer edge and the upper defining edge 51 of slot 48; and a cement connection 90 is made to arm 34 at substantially the lowest location the wafer 12 extends through slot 48. Similarly, a cement connection 92 is made to arm 36 at substantially the highest location the wafer 12 extends through slot 48 which includes the location of contact between the wafer edge and the upper defining edge 51 of slot 48; and a cement connection 94 is made to arm 36 at substantially the lowest location the wafer 12 extends through slot 48.

The seven fixed connections shown in FIG. 14 for attaching the crystal wafer 12 to the holder 10 safeguard the crystal 12 against extreme high impact and vibration without any appreciable effect on the desired electrical characteristics of the crystal. Each of the connections is at the periphery of the crystal and at the upper and lower portions of the crystal, and not within a central plane which could effect the vibratory characteristics of the crystal.

The description of the preferred embodiment of this invention is intended merely as illustrative of the subject invention, the scope and limits of which aer set forth in the following claims:

I claim:

1. A piezoelectric crystal device comprising:

a crystal wafer;

a holder including a base and a pair of spaced apart arms secured to the base at the lower end thereof and extending outward therefrom, each of the arms comprising a body portion and a fork portion at the outer end of the body portion;

a slot formed in the body portion of each of said arms, said slot having an upper edge, a lower edge and side edges;

said fork portion including a slit separating a pair of prongs, the width of the slit being less than the width of the slot; and a support member extending outward from the base and positioned between the arms, said arms being spreadable away from each other from a normal position to an outer position for inserting said crystal between the arms and in association with the support member, said wafer being operatively received in said slit and slot of each of said arms and the upper edges of the slots abutting adjacent edges of the wafer for retaining the wafer in the holder.

2. The holder of claim 1, wherein each of said arms is an elongated spring which is movable away from each other and resiliently returns toward the normal position, said abutting of the upper edge of the slot with the wafer preventing said arms from returning to said normal position.

3. The holder of claim 1, wherein said support member is a seat on which the crystal wafer is positioned.

4. The holder of claim 1, wherein the width of said slit is greater than the thickness of the crystal wafer.

5. The holder of claim 1, wherein the longitudinal center lines of the slit and slot lie substantially on the same plane.

6. The holder of claim 1, wherein the crystal wafer is cemented to said holder, so that:

said prongs of one of said arms are connected to the crystal wafer at the upper part thereof;

said prongs of the other said arm are connected to the crystal wafer at the upper part thereof and spaced laterally from said connection of said prongs of said one arm; and said seat is connected to the crystal wafer at the lower part of the wafer between said connections of the prongs of said arms.

7. The holder of claim 6, wherein at least two of said connections are electrical connections between the holder and the crystal wafer.

8. The holder of claim 1, wherein the abutting of the upper edge of the slot with the wafer prevents the arm from returning to the normal position, and thereby retaining the crystal in the holder under a slight tension.

9. The holder of claim 1, wherein the fork of one arm extends inward and the fork of the other arm extends inward toward the other arm.

10. The holder of claim 6, wherein the contact of the edge of the crystal with the outer defining edge of the slot of one of said arms is cemented to provide a fixed connection; and the contact of the edge of the crystal with the outer defining edge of the slot of the other arm is also cemented to provide a fixed connection.

11. The holder of claim 10, wherein substantially the lowest part of the crystal wafer extending through the slot of one of said arms is cemented to adjacent and non-contacting parts of the body of said one arm; and substantially the lowest part of the crystal extending through the slot of the other arm is cemented to adjacent non-contacting parts of the body of said other arm.

12. The holder of claim 1, wherein each of said arms is substantially formed into a Z configuration having a body portion, a fork at the outer end thereof, and said holder further including a linking inner portion for connecting the body portion of the arm with the base, said linking portion extending the arm inward from the association with the vase to enable the arms to receive various sized crystals.

13. A holder for a crystal wafer comprising:

a base;

a pair of spaced apart spring arms extending outward from the base, each of said arms including a body portion and a fork portion at the outer end of the body portion, said fork portion of one arm extending inward toward the fork portion of the other arm;

a slot formed in the body portion of each of said arms, said slot having an upper edge, a lower edge and side edges; and said fork portion including a slit separating a pair of prongs, the width of said slit being greater than the thickness of said wafer and the width of said slot being greater than the width of said slit, said arms being spreadable from a normal position to an outer position upon the application of an external force for inserting the wafer between said arms, said arms resiliently returning toward said normal position upon the removal of the external force for receiving said wafer in said slit and said slot of said corresponding arms, the upper edges of said slots contacting said wafer for retaining the wafer between the arms.

14. The holder of claim 13 includes a support member positioned between said arms, to provide support for said wafer when retained between said arms.

* * * * *